United States Patent
Lin

(10) Patent No.: US 8,771,026 B2
(45) Date of Patent: Jul. 8, 2014

(54) CONDUCTIVE ASSEMBLY HAVING A CLAMP STRUCTURE

(71) Applicant: K.S. Terminals Inc., Changhua County (TW)

(72) Inventor: Chih-Hsin Lin, Changhua County (TW)

(73) Assignee: K.S. Terminals Inc., Changhua County (TW)

( * ) Notice: Subject to any disclaimer, the term of this patent is extended or adjusted under 35 U.S.C. 154(b) by 0 days.

(21) Appl. No.: 13/867,700

(22) Filed: Apr. 22, 2013

(65) Prior Publication Data

US 2013/0237103 A1  Sep. 12, 2013

Related U.S. Application Data

(63) Continuation of application No. 13/103,518, filed on May 9, 2011, now abandoned.

(30) Foreign Application Priority Data

Feb. 23, 2011 (TW) .............................. 100203260 U

(51) Int. Cl.
*H01R 11/03* (2006.01)

(52) U.S. Cl.
USPC ............................ 439/786; 439/790; 439/888

(58) Field of Classification Search
USPC ......................... 439/888, 786, 790
IPC . H01R 4/4845,4/4809, 4/023, 4/50; B25B 5/06, B25B 5/14
See application file for complete search history.

(56) References Cited

U.S. PATENT DOCUMENTS

| | | | |
|---|---|---|---|
| 3,922,052 A * | 11/1975 | Blevins | 439/510 |
| 3,950,071 A * | 4/1976 | McGann et al. | 439/221 |
| 4,087,149 A * | 5/1978 | Fischer | 439/435 |
| 4,332,060 A | 6/1982 | Sato | |
| 4,460,239 A * | 7/1984 | Inoue | 439/786 |
| 4,696,081 A | 9/1987 | Yen | |
| 4,883,397 A | 11/1989 | Dubost | |
| 4,910,907 A | 3/1990 | Schlaegel | |
| 5,214,825 A | 6/1993 | Hirzel | |
| 5,595,416 A | 1/1997 | Horwill | |
| 5,950,283 A | 9/1999 | Sato | |
| 6,226,840 B1 | 5/2001 | Lu | |
| 6,374,463 B1 | 4/2002 | Kaufman | |
| 6,842,949 B2 | 1/2005 | Warren | |
| 7,120,969 B2 | 10/2006 | Carls | |
| 7,568,855 B2 | 8/2009 | Fitzler et al. | |

* cited by examiner

*Primary Examiner* — Hien Vu
(74) *Attorney, Agent, or Firm* — Muncy, Geissler, Olds & Lowe, P.C.

(57) ABSTRACT

A conductive assembly having a conductive terminal, a conductive ribbon, and a clamp structure is disclosed. The clamp structure includes a base plate and a pair of jaws. The jaws extend respectively from two transverse sides of the base plate and form a V-shape opening being opposite to the base plate. An aperture is formed longitudinally in the center of the base plate, wherein the transverse width of the aperture is wider than the opening. The clamp structure stably and firmly holding the conductive terminal and the conductive ribbon.

3 Claims, 6 Drawing Sheets

CONDUCTIVE ASSEMBLY HAVING A CLAMP STRUCTURE

CROSS-REFERENCE TO RELATED APPLICATIONS

This application is a Continuation Application of U.S. patent application Ser. No. 13/103,518 entitled "CLAMP STRUCTURE" filed on May 9, 2011, which claimed a priority to the foreign patent application in Taiwan with filing No. TW100203260, filed on Feb. 23, 2011.

BACKGROUND OF THE INVENTION

1. Technical Field

The present invention relates to a conductive assembly having a clamp structure and, in particular, to a clamp structure used for connecting the conductive ribbon and the conductive terminal.

2. Description of Related Art

With an increasing shortage of modern energy, the development of new energy sources—such as the solar cell—has drawn great attention from the international community. The solar cell has a plurality of advantages such as environmental friendliness, energy saving, and a wide application range. Also, the solar cell technology is currently more mature than any other alternative new energy technologies. However, the improvement of solar cell performance is still the common goal in the industry. For example, the junction box is an important part in the solar cell assembly. It is used for gathering and outputting the electricity produced by the solar cell. The solar cell assembly can't output the electricity normally nor work out its electricity generating function without the junction box.

The conductive terminal of the junction box has to be connected to the conductive ribbon of the solar panel. The solar cell assembly must be placed outdoors so that the conductive ribbon disconnected from the terminal easily by the outside influence. In that case, the power output of the solar cell will be interrupted. In the prior art, a clamp structure is used for fixing the conductive ribbon to the conductive terminal of the junction box. Then they are connected by welding or adhering for strengthening the stability of the connection therebetween and ensuring the power delivering normally.

However, in the prior art, when the workers work on the connecting of the conductive ribbon and the terminal, they can hardly observe the junction area inside the clamp structure. What's more, the welding or adhering tool can't be inserted easily into the clamp structure to achieve the connection. These difficulties lead to insufficient connection between the conductive ribbon and the terminal, so that the conductive ribbon disconnected from the terminal easily and the power output of the solar cell will be interrupted. Therefore, it is an important issue to develop a novel clamp structure for the workers to connect the conductive ribbon to the terminal efficiently and conveniently without mistakes.

In view of the above, it is a goal of research and development in the relevant industry to overcome the shortcomings of the clamp structure in the prior art for connecting the conductive terminal and the conductive ribbon with increasing convenience and lower cost.

BRIEF SUMMARY OF THE INVENTION

To overcome the foregoing technical shortcomings of the prior art, the present invention provides a novel clamp structure. The clamp structure includes a base plate and a pair of jaws. The jaws extend respectively from two longitudinal sides of the base plate and form a jaw opening opposite to the base plate. The clamp structure is characterized in having an aperture formed longitudinally in the center of the base plate, and the transverse width of the aperture is wider than the jaw opening.

The primary objective of the present invention is to provide a novel clamp structure for the workers to connect the conductive terminals and the ribbon conveniently. The clamp structure includes the base plate and the pair of jaws. The jaws extend respectively from two longitudinal sides of the base plate and form the jaw opening opposite to the base plate. The clamp structure has the aperture formed longitudinally in the center of the base plate, and the transverse width of the aperture is wider than the jaw opening. The workers can pull out one end of the conductive ribbon covering the conductive terminal from inside of the clamp structure to protruding outside of the clamp structure; thereby the workers can connect the conductive ribbon and the conductive terminal directly and conveniently.

Another objective of the present invention is to provide a clamp structure for being able to protrude the conductive ribbon outside of the clamp such that the connecting tool used by the worker can be applied easily. The clamp structure includes the base plate and the pair of jaws. The jaws extend respectively from two longitudinal sides of the base plate and form the jaw opening opposite to the base plate. The clamp structure has the aperture formed longitudinally in the center of the base plate, and the transverse width of the aperture is wider than the jaw opening. The workers can pull out one end of the conductive ribbon from inside of the clamp structure to expose more of it; thereby the connecting tool used by the worker can be applied easily, the connection between the conductive ribbon and the conductive terminal can be more complete. Furthermore, it raises the stability of the connection between the conductive ribbon and the conductive terminal.

Another objective of the present invention is to provide a clamp structure for the workers to see the conductive ribbon and the conductive terminal clearly while work on the connection thereof. The clamp structure includes the base plate and the pair of jaws. The jaws extend respectively from two longitudinal sides of the base plate and form the jaw opening opposite to the base plate. The clamp structure has the aperture formed longitudinally in the center of the base plate, and the transverse width of the aperture is wider than the jaw opening. The workers can pull out one end of the conductive ribbon from inside of the clamp structure to expose more of it; thereby the workers can see the conductive ribbon and the conductive terminal clearly while work on the connection thereof. It enhances the convenience of the connecting operation, strengthens the stability of the connection between the conductive ribbon and the junction box, and further ensures the power delivering function of the solar cell acting well.

Another objective of the present invention is to provide a clamp structure for fixing the relative position of the clamp structure and the conductive terminal. The clamp structure includes the base plate and the pair of jaws. The jaws extend respectively from two longitudinal sides of the base plate and form the jaw opening opposite to the base plate. The clamp structure includes an engaging hole formed on a holding portion of at least one jaw. The engaging hole can be fixed to the corresponding protrusion portion on the conductive terminal for fixing the relative position of the clamp structure and the conductive terminal. Therefore, the stability of the combination between the clamp structure and the conductive ribbon on the conductive terminal will be strengthened.

Another objective of the present invention is to provide a clamp structure for reducing the necessaries of repairing and lengthening the service life of the solar cell. The clamp structure has the aperture formed longitudinally in the center of the base plate, and the transverse width of the aperture is wider than the jaw opening. The workers can see the conductive ribbon and the conductive terminal clearly while work on the connection thereof; thereby it strengthens the stability of the combination between the conductive ribbon and the conductive terminal, reduces the necessary of repairing, lengthens the service life of the solar cell, and further lowers the overall cost while increasing productivity.

DETAILED DESCRIPTION OF THE INVENTION

The present invention discloses a clamp structure wherein the clamping method employed is understandable to people of ordinary skill in the art and therefore is not described in detail herein. Also, the drawings referred to in the following description only schematically depict structures related to the technical features of the present invention and hence are not, and need not be, drawn to scale.

Figure 1:
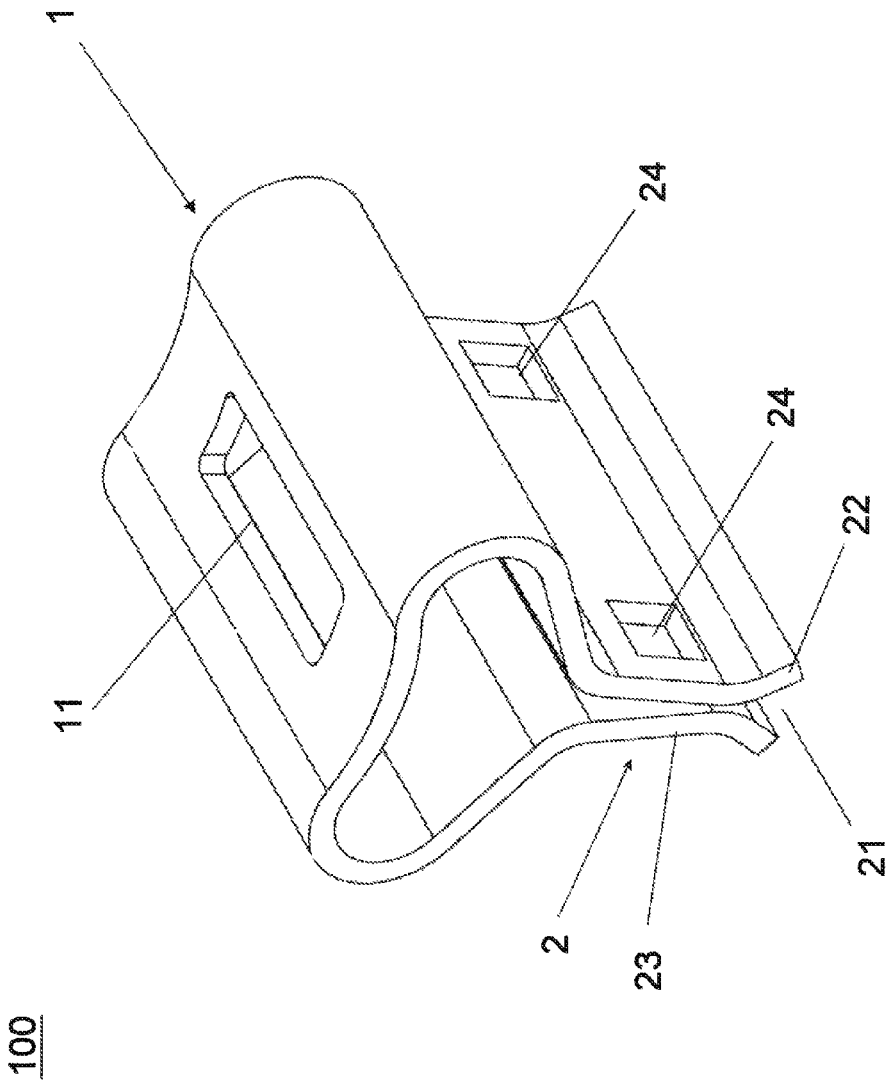
FIG. 1 is a schematic perspective view of the clamp structure in accordance with the first preferred embodiment of the present invention.
Figure 2:
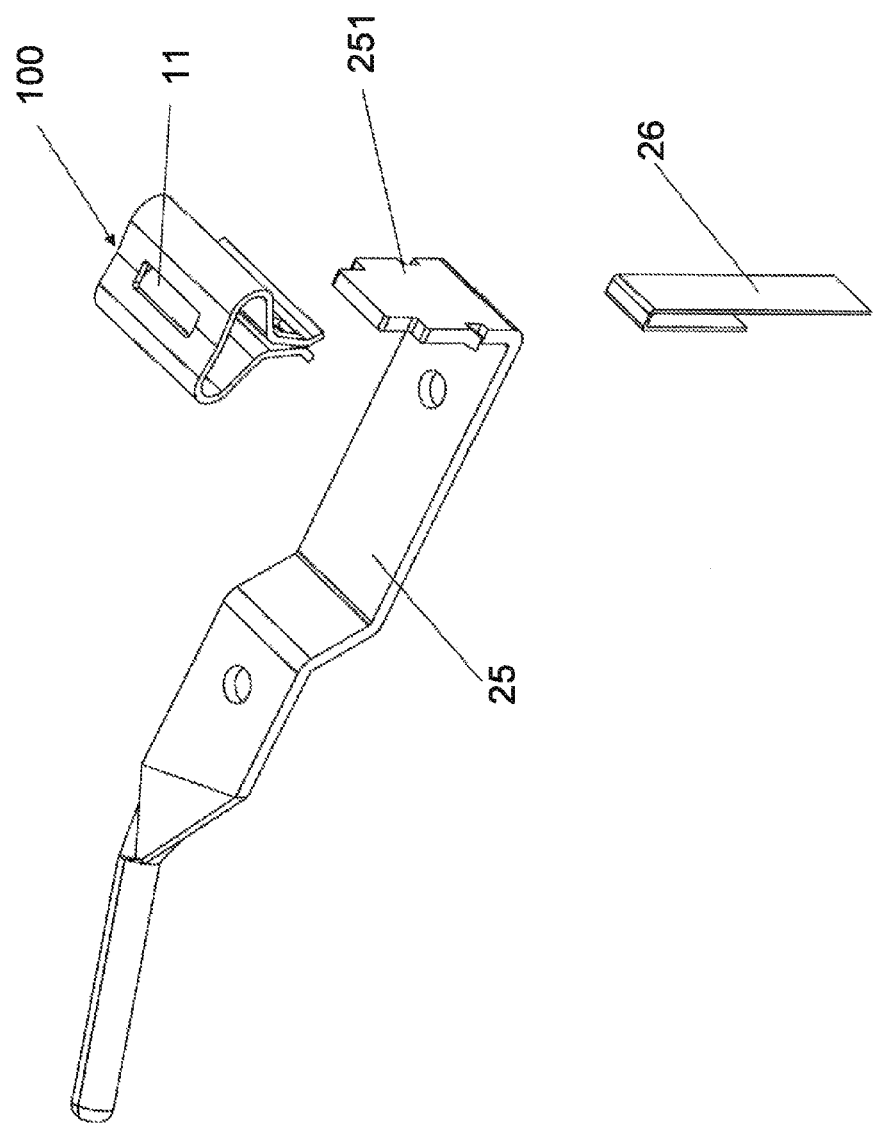
FIG. 2 is an exploded view illustrating the combination of the clamp structure and the conductive terminal in accordance with the first preferred embodiment of the present invention.

Referring to FIG. 1, a clamp structure 100 is illustrated in accordance with the first preferred embodiment of the present invention. The clamp structure 100 includes a base plate 1 and a pair of jaws 2. The jaws 2 extend respectively from two longitudinal sides of the base plate 1 and form a jaw opening 21 opposite to the base plate 1. As shown in FIG. 2, the jaw opening 21 allows the conductive terminal 25 and the conductive ribbon 26 being put and clamped in the clamp structure 100 through it. The clamp structure 100 has an aperture 11 formed longitudinally in the center of the base plate, and the transverse width of the aperture 11 is wider than the jaw opening 21.

Figure 3:
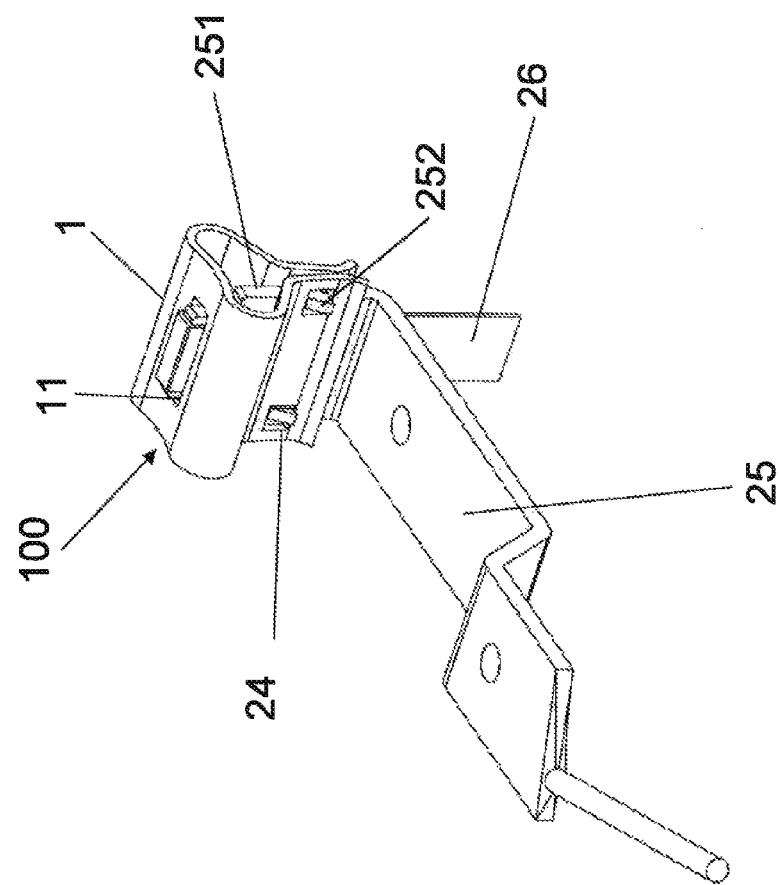
FIG. 3 is a schematic perspective view illustrating the combination of the clamp structure and the conductive terminal in accordance with the first preferred embodiment of the present invention.

Referring to FIGS. 2 and 3, the conductive ribbon 26 has a part covering the engaging end 251 of the conductive terminal 25. The workers can connect the conductive terminal and the ribbon conveniently by pulling them out from inside of the clamp structure 100 through the aperture 11. By the way, the workers can see clearly the junction area between the conductive terminal 25 and the conductive ribbon 26 while operating the connection such that the connection can be carried out more smoothly and more efficiently. In this embodiment, the connecting tool is welding torch and the connecting material is solder. However, the connecting tool and material are not limited by this embodiment; instead, adhesion or any other connecting tool and material which can achieve the same objective can be used in the present invention.

Figure 4:
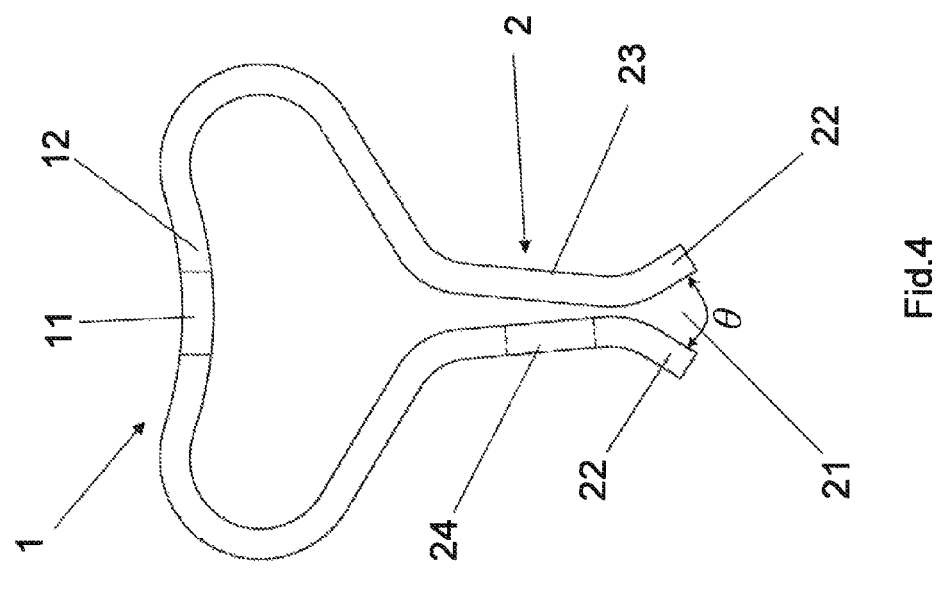
FIG. 4 is a cross-sectional view of the clamp structure in accordance with the first preferred embodiment of the present invention.

Referring to FIG. 4, the clamp structure 100 further comprises a concave area 12 formed in the center of the base plate 1, wherein the aperture 11 is formed in the concave area 12. The mechanical structure of the concave area 12 provides higher flexibility and clamping force to the clamp structure 100 such that the convenience and safety during the connecting operation can be ensured.

At the same time, each of the jaw 2 has an end portion 22 at the jaw opening 21. The pair of end portions 22 extend outwardly to form a V-shape jaw opening 21 with an included angle θ. The wilder V-shape jaw opening 21 allows the conductive terminal 25 and the conductive ribbon 26 to enter the clamp structure 100 more easily. In addition, each jaw has a holding portion 23 near the end portion 22. The holding portion 23 is flat and good for holding the conductive terminal 25 and the conductive ribbon 26 inside the clamp structure 100 stably and firmly.

Figure 5:
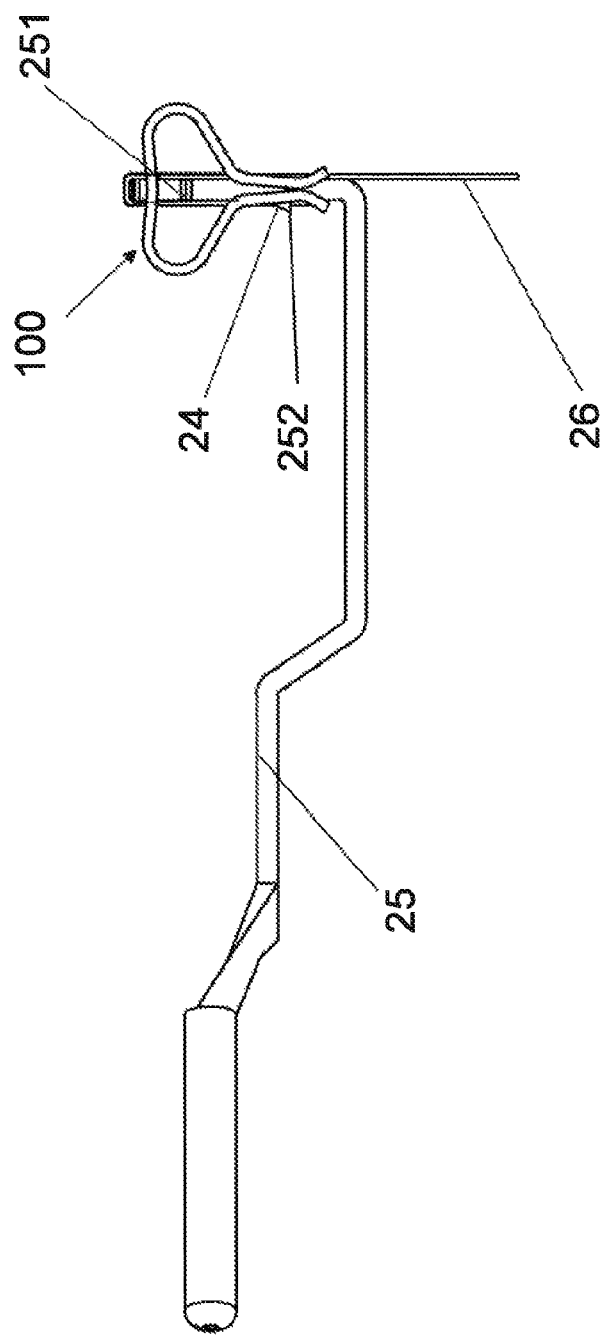
FIG. 5 is a cross-sectional view illustrating the combination of the clamp structure and the conductive terminal in accordance with the first preferred embodiment of the present invention.

Referring to FIG. 4, the clamp structure 100 is illustrated in accordance with the first preferred embodiment of the present invention. The clamp structure 100 includes a pair of engaging holes 24 formed on at least one of the holding portions 23. As shown in FIG. 5, the engaging holes 24 correspondingly allow two protrusion portions 252 on the conductive terminal 25 to pass for fixing the relative position of the clamp structure 100 and the conductive terminal 25. Therefore, the installation of the clamp structure 100 and the conductive terminal 25 will not be incorrect. In addition, the design further strengthens the combination between the clamp structure 100 and the conductive terminal 25 after the installation. According to another embodiment of the present invention, the clamp structure 100 includes one engaging hole 24 formed on the holding portion 23 of at least one jaw 2.

Figure 6:
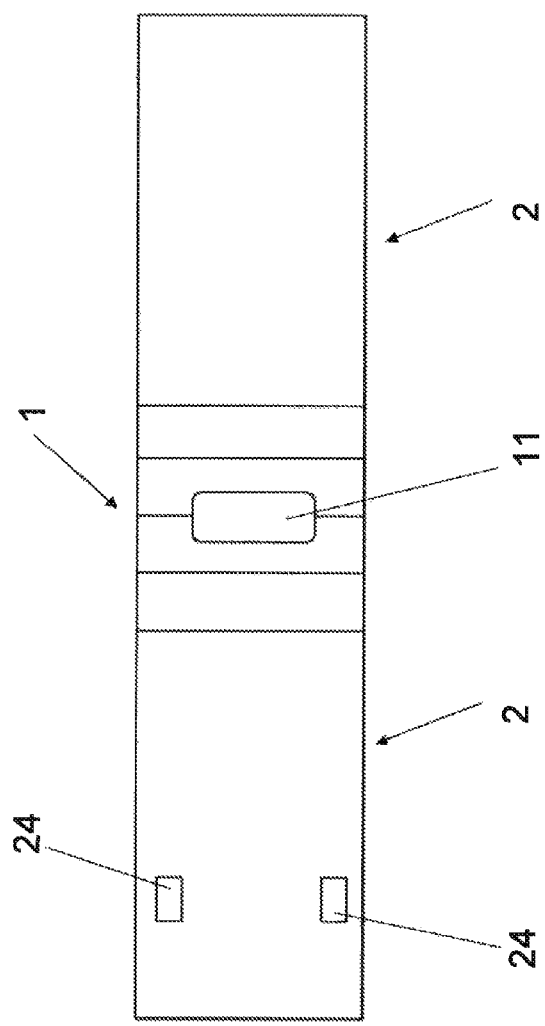
FIG. 6 is a top view unfolded drawing of the clamp structure in accordance with the first preferred embodiment of the present invention.

FIG. 6 is a top view unfolded drawing of the clamp structure 100 according to the first embodiment of the present invention. It is noticeable that the shape and the number of the engaging holes 24 are not limited by the embodiment. The shape and the number of the engaging holes 24 can be designed and changed variously depending on demand.

In summary, the clamp structure proposed by the present invention is structurally simple and is effective in clamping the conductive ribbon and the conductive terminal of the junction box securely as well as preventing them from loosening. By contrast, in the connecting operation by using the conventional clamp structure, there is no enough space for the workers to observe the inside of the conventional clamp structure. What's more, the welding or adhering tool can't be inserted easily into the clamp structure to achieve the connection. These difficulties lead to insufficient connection between the conductive ribbon and the conductive terminal, so that the conductive ribbon disconnected from the terminal easily. In the prior art, the inconvenience causes longer time for the workers to achieve the installation and further affects the life length of the solar cell. By using the present invention, the maintain fee and installation cost can be saved, and it's more convenient to assemble the parts. The workers can work on the installation rapidly without wasting time, thereby lowering the overall cost while increasing productivity.

What described above is only the preferred embodiment of the present invention and is not intended to confine the scope of the present invention. Moreover, as the above description shall be understandable to and can be implemented by people of ordinary skill in the art, any equivalent variations or modifications which do not depart from the spirit of the present invention should be encompassed by the appended claims.

What is claimed is:

1. A conductive assembly, comprising:
   a conductive terminal (25) having a body and an end portion (251) extending perpendicular from the body and formed with at least one bent protrusion portion (252);
   an elongated conductive ribbon (26) having one end bent part covering the end (251) of the conductive terminal (25); and
   a clamp structure (100) including:
   a base plate (1) longitudinally formed with an aperture (11) in a center of the base plate (1); and
   a pair of jaws (2) extending respectively from two longitudinal sides of the base plate (1), each of the jaws (2) having an end portion (22) extending outwardly to form a V-shape opening (21) with an included angle between the end portions (22), the opening (21) being opposite to the base plate (1), each of the jaws (2) having a flat plate holding portion (23) near the end portion (22) with at least one engaging hole (24) formed in one of the flat plate holding portions (23);
   wherein a transverse width of the aperture (11) is wider than the opening (21) and the end (251) of the conductive terminal (25), and the conductive ribbon (26) being received inside of the clamp structure (100) through the opening (21) with the one end bent part of the conductive ribbon (26) covering the end (251) of the conductive terminal (251) being pulled out from the inside of the clamp structure (100) through the aperture (11), the at least one engaging hole (24) correspondingly allow the at least one bent protrusion portion (252) of the conductive terminal (25) to fit therein, and the flat holding portions (23) stably and firmly holding the end (251) of the conductive terminal (25) and the conductive ribbon (26), whereby a position of the clamp structure (100) and the conductive terminal (25) is fixed.

2. The conductive assembly of claim 1, wherein the clamp structure further including a concave area (12) formed in the center of the base plate (1), and the aperture (11) is formed in the concave area (12).

3. The conductive assembly of claim 1, wherein the end (251) is formed with two protrusion portions (252) and one the flat plate holding portions (23) is formed with two engaging holes (24) and the two engaging holes (24) correspondingly allow the two protrusion portions (252) of the conductive terminal (25) to pass.

* * * * *